United States Patent
Chang

(10) Patent No.: US 9,521,790 B2
(45) Date of Patent: Dec. 13, 2016

(54) PANEL AND METHOD FOR MANUFACTURING THE SAME

(71) Applicant: HON HAI PRECISION INDUSTRY CO., LTD., New Taipei (TW)

(72) Inventor: Shao-Han Chang, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 277 days.

(21) Appl. No.: 14/087,143

(22) Filed: Nov. 22, 2013

(65) Prior Publication Data

US 2014/0160648 A1  Jun. 12, 2014

(30) Foreign Application Priority Data

Dec. 10, 2012 (CN) .................. 2012 1 05248767

(51) Int. Cl.
| | |
|---|---|
| *C04B 33/24* | (2006.01) |
| *G06F 1/16* | (2006.01) |
| *H05K 13/00* | (2006.01) |
| *C04B 33/32* | (2006.01) |
| *C04B 35/486* | (2006.01) |
| *C04B 35/593* | (2006.01) |
| *C04B 35/645* | (2006.01) |

(52) U.S. Cl.
CPC .............. *H05K 13/00* (2013.01); *C04B 33/24* (2013.01); *C04B 33/326* (2013.01); *C04B 35/486* (2013.01); *C04B 35/593* (2013.01); *C04B 35/645* (2013.01); *G06F 1/1626* (2013.01); *C04B 2235/6562* (2013.01); *Y10T 29/49002* (2015.01)

(58) Field of Classification Search
CPC ...... C03C 27/04; C03C 27/042; C04B 35/593; C04B 35/622; C04B 35/62222; G04B 39/006; G06F 1/1626; Y10T 29/49002
See application file for complete search history.

(56) References Cited

U.S. PATENT DOCUMENTS

| | | | |
|---|---|---|---|
| 3,023,492 A * | 3/1962 | Bristow | C04B 41/009 106/1.05 |
| 3,227,032 A * | 1/1966 | Upton | C03B 37/02754 250/353 |
| 3,267,204 A * | 8/1966 | Peters | H01B 17/66 156/325 |

(Continued)

FOREIGN PATENT DOCUMENTS

| | | | | |
|---|---|---|---|---|
| CH | 632891 A | * | 11/1982 | ........... C03C 27/042 |
| CN | 1431979 A | | 7/2003 | |

(Continued)

OTHER PUBLICATIONS

Tomisa, "Joining Alumina to Sapphire for Copper Vapor Laser Tubes", Sep. 10, 1990, Naval Coasta Systems Center, pp. 1-12.*

(Continued)

*Primary Examiner* — Jacob Cigna
(74) *Attorney, Agent, or Firm* — Zhigang Ma

(57) ABSTRACT

A panel includes a display window and a supporting body integrated with the display window. The display window is made of sapphire and the supporting body is made of ceramic materials. The supporting body is integrally formed with the supporting body by sintering process. A method for manufacturing the panel is also provided.

11 Claims, 6 Drawing Sheets

(56) References Cited

U.S. PATENT DOCUMENTS

| | | | | |
|---|---|---|---|---|
| 3,485,658 | A | * | 12/1969 | Iler .................. C03C 17/00 427/354 |
| 3,736,158 | A | * | 5/1973 | Cullen ................ C30B 15/00 117/902 |
| 3,859,714 | A | * | 1/1975 | DeLuca ............... C30B 29/20 156/89.12 |
| 5,137,852 | A | * | 8/1992 | Morgan ............... C04B 35/111 428/366 |
| 5,954,900 | A | * | 9/1999 | Hegner ............... C04B 35/645 156/306.6 |
| 6,663,736 | B1 | * | 12/2003 | Ardini ................ C30B 33/06 156/153 |
| 7,294,408 | B2 | * | 11/2007 | Bauer ................. C04B 35/6365 257/107 |
| 2004/0043225 | A1 | * | 3/2004 | Bauer ................. C04B 35/6365 428/426 |
| 2006/0162849 | A1 | * | 7/2006 | Han ................... C03C 27/06 156/153 |
| 2008/0160472 | A1 | * | 7/2008 | Chang ................. F27B 14/04 432/13 |
| 2012/0225767 | A1 | * | 9/2012 | Imholt ................ B29D 11/00 501/1 |

FOREIGN PATENT DOCUMENTS

| | | | | |
|---|---|---|---|---|
| GB | 1054753 | A | * 1/1967 | ............ C03C 3/145 |
| TW | 200909216 | A | 3/2009 | |
| TW | 201137463 | A1 | 11/2011 | |
| TW | 201141800 | A1 | 12/2011 | |

OTHER PUBLICATIONS

Pei Ching Yu, "On the High Pure Alumina Composite powder for Sintering at 1400C, A Preliminary Investigation", 2006, Department of Resources Engineering National Cheng Kung University.*

* cited by examiner

PANEL AND METHOD FOR MANUFACTURING THE SAME

BACKGROUND

1. Technical Field

The present disclosure relates to a panel and a method for manufacturing the same.

2. Description of Related Art

An electronic device includes a display panel made of glass. The glass has the advantages of good transparency and low-cost. However, as the hardness of the glass is low, the display panel can be easily scratched, affecting the appearance of the electronic device.

Therefore, there is room for improvement in the art.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout several views.

DETAILED DESCRIPTION

Figure 1:
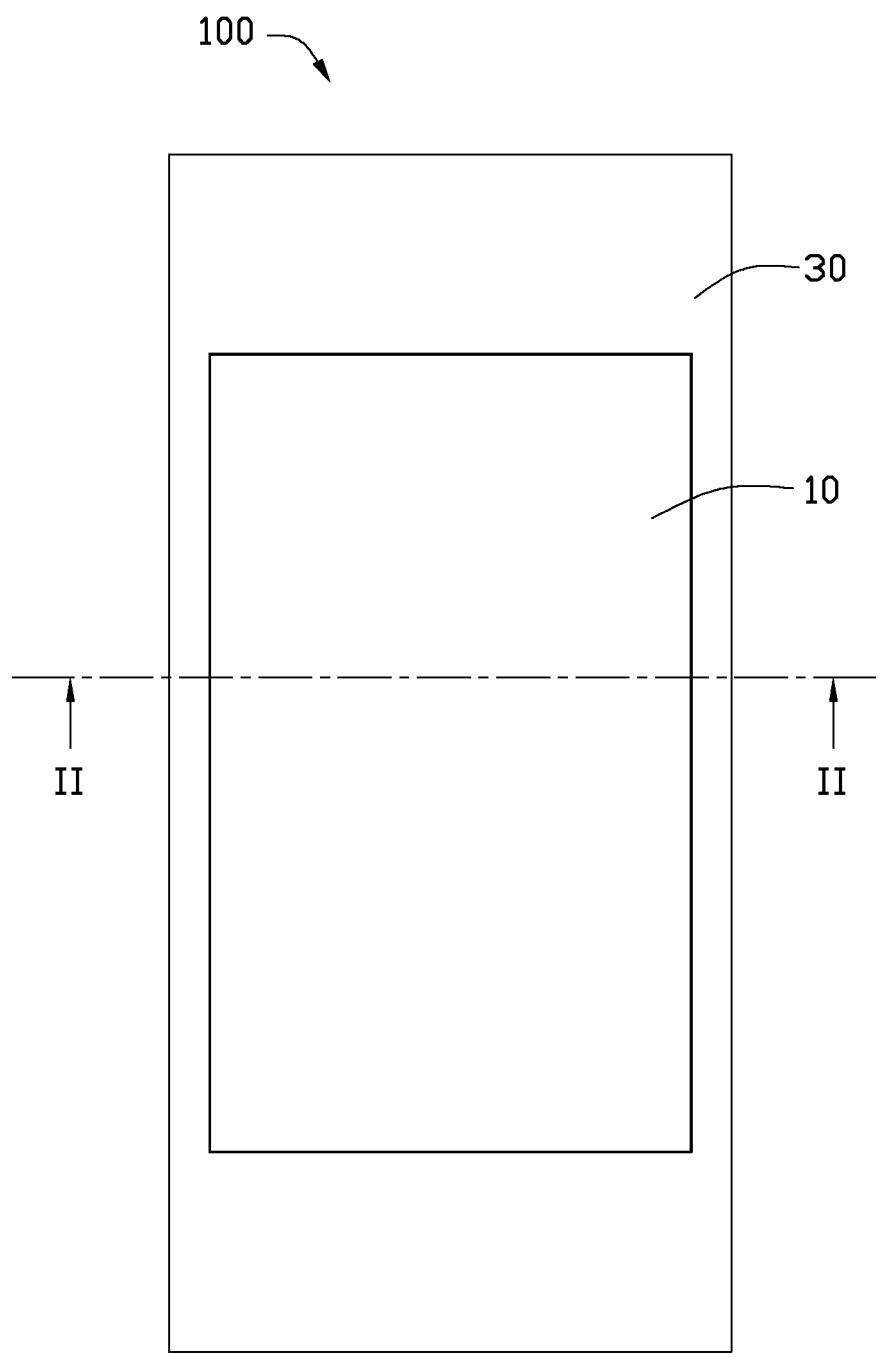
FIG. 1 is an isometric view of a panel in an embodiment of this disclosure.
Figure 2:
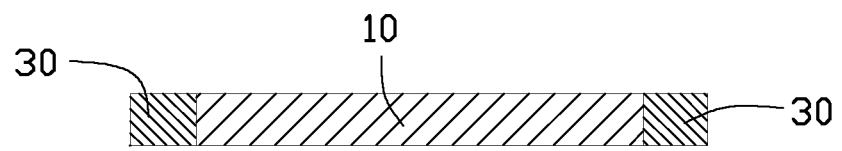
FIG. 2 is a cross-sectional view taken along line II-II of FIG. 1.
Figure 3:
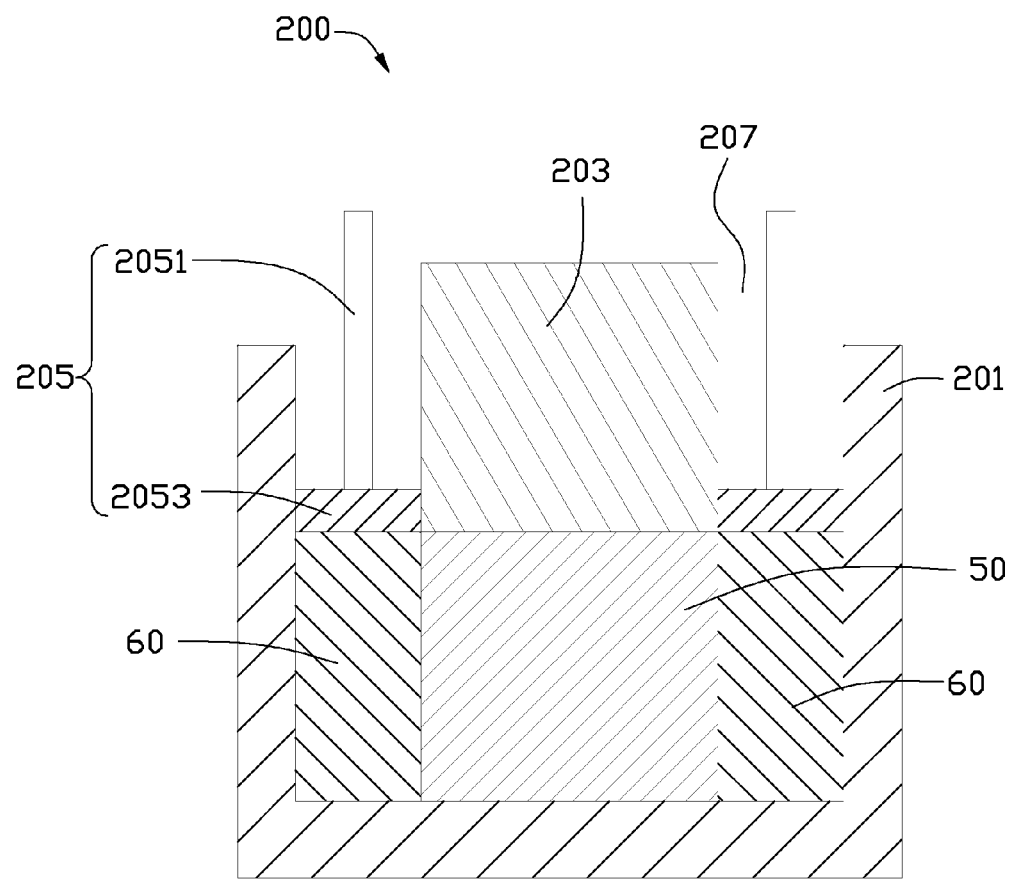
FIG. 3 is a cross-sectional view of a sintering furnace configured to manufacture the panel of FIG. 1 in a first embodiment.
Figure 4:
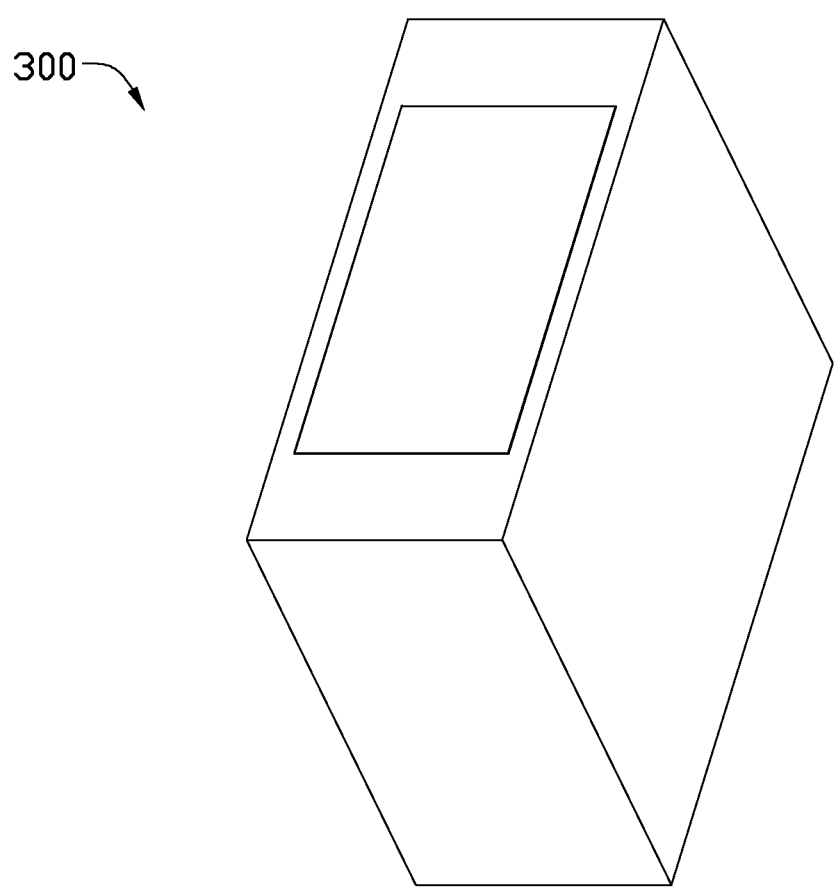
FIG. 4 is a composite of sapphire and ceramic made by sintering.
Figure 5:
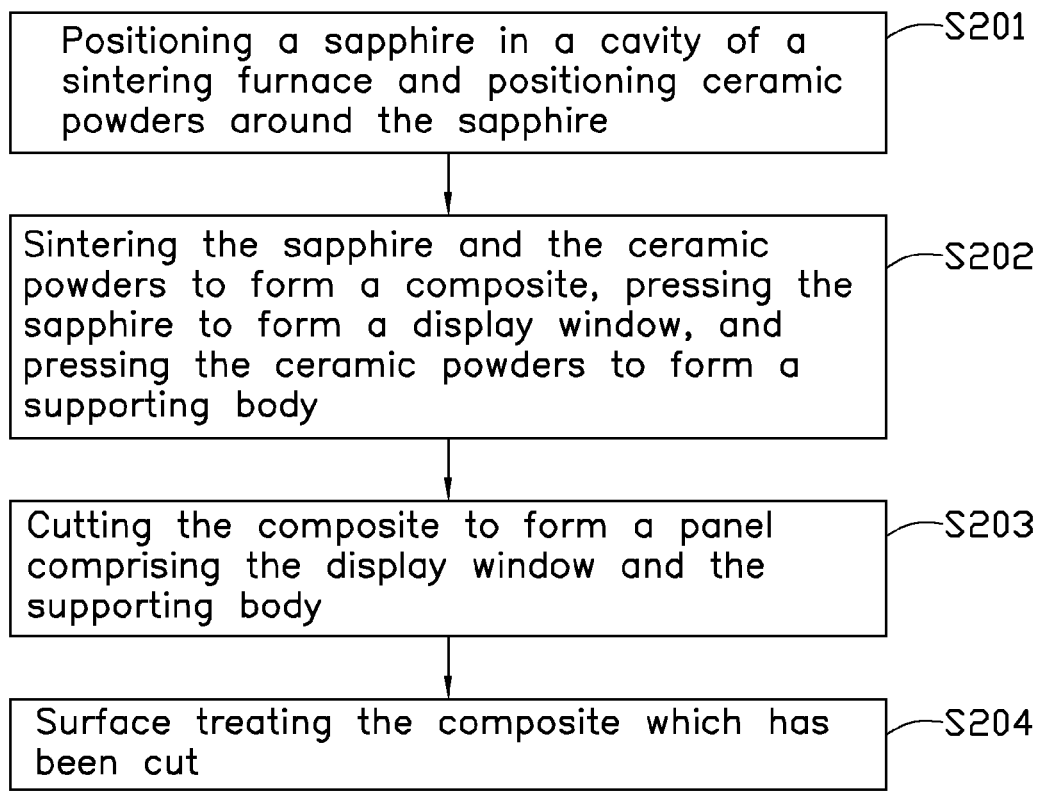
FIG. 5 is a flowchart of a method for manufacture the panel in FIG. 1.

FIG. 1 and FIG. 2 show the panel 100 of a first illustrated embodiment of this disclosure. The panel 100 is made of a composite of sapphire and ceramic materials. The panel 100 includes a display window 10 and a supporting body 30 integrated with the display window 10. The display window 10 is made of sapphire materials. As the display window 10 has the characters of good transparency and high hardness, it can be configured as the display window in electronic devices, such as mobile phone, tablet computers, wrist watch, MP3 and MP4. The supporting body 30 is made of ceramic materials and is configured for mounting the display window 10 to the electronic device. The supporting body 30 can be made of zirconia, silicon nitride, steatite porcelain or other ceramic materials. In the embodiment of this disclosure, the panel 100 is a mobile panel. The panel 100 is a plate sheet, the display window 10 is positioned in the center of the panel 100, and the supporting body 30 is formed around the periphery of the display window 10. The supporting body 30 is integrally formed with the display window 30 by sintering process. According to the design of the panel 100, the display window 10 can be formed on the edge of the panel 100, and the supporting body 30 can be formed on at least one side of the display window 10 to mount the display window 10 to the electronic device.

FIG. 2 to FIG. 5 show the process of manufacturing the panel 100 in the first embodiment is as follows.

In step S201, sapphire 50 are positioned in a cavity 207 of a sintering furnace 200 and ceramic powders 60 are positioned around the sapphire 50. The sintering furnace 200 further includes a mold 201, a clamping member 203 configured for pressing the sapphire 50, and a pressing module 205 configured for pressing the ceramic powders 60. In the illustrated embodiment, the pressing module 205 is a hydraulic module including a strut 2051 and an abutting portion 2053 which is connected to one end of the strut 2051. The mold 201 is made of graphite.

In the embodiment of this disclosure, the sapphire 50 is fixed on the portion about the center of the cavity 207, and the ceramic powders 60 are filled around the sapphire 50 in the cavity 207. The sapphire 50 is cut to a designed shape. The length and the width of the sapphire 50 are matched with the display area of the mobile panel. The ceramic powders 60 is aluminum oxide powders.

In step S202, the sapphire 50 and ceramic powders 60 are sintered to form a composite 300 of sapphire integrated with ceramic materials, the sapphire 50 is pressed to form a display window, and the ceramic powders 60 are pressed to form a supporting body. In the embodiment of this disclosure, the upper surface of the sapphire 50 is pressed by the clamping member 203, and the upper surface of the ceramic powders 60 is pressed by the pressing module 205. At this time, a sintering process is carried out at high temperature and high pressure, protected by the argon gas, nitrogen gas or other inset gas. The conditions of the sintering process are as follows. The temperature is at 1400° C. to 1600° C., the pressure is at 10 to 40 Mpa, and the heating rate is at 10-30° C./min. When the temperature and pressure are raised to the preset value, the constant temperature and pressure is kept for 0.5 to 2 hours. In other embodiment, the sapphire 50 and the ceramic powder 60 may be sintered in vacuum. The ceramic powder 60 may be zirconia powder, silicon nitride powder, steatite porcelain powder or other ceramic powder. The sapphire 50 is pressed to form a display window, and the ceramic powders 60 are pressed to form a supporting body.

In step S203, the composite 300 is cut to form the panel 100. The panel 100 includes the display window 10 made of sapphire and the supporting body 30 made of ceramic materials. In the embodiment of this disclosure, the length and the width of the composite materials 300 after cut are matched with the mobile phone respectively.

In step S204, a surface treatment process is carried out on the panel 100. In the embodiment of this disclosure, the surface of the panel 100 is being grinded and polished to increase the flatness and the smoothness.

Figure 6:
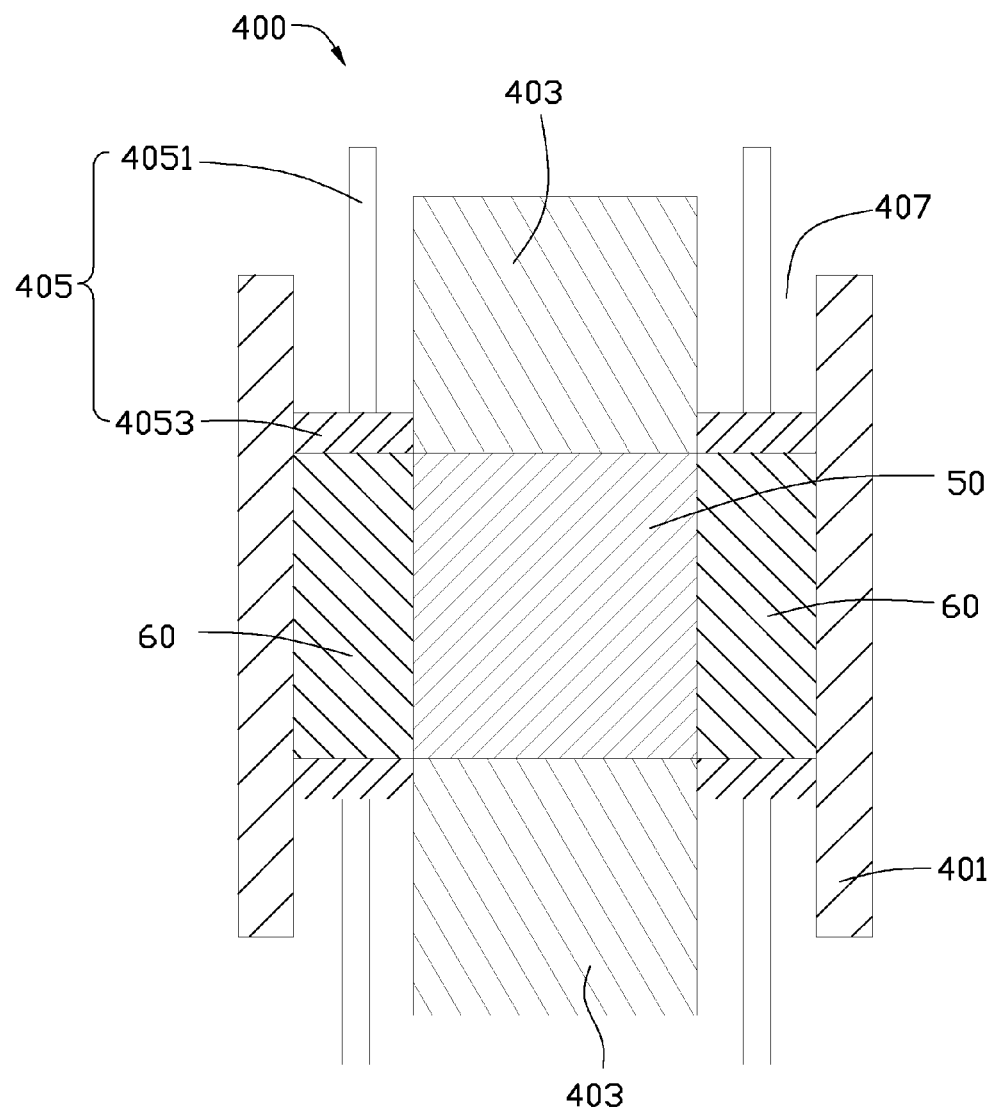
FIG. 6 is a cross-sectional view of the sintering furnace configured to manufacture the panel in a second embodiment.

FIG. 6 shows that the manufacturing process of the panel 100 in a second embodiment is almost same as the first embodiment. The sintering furnace 400 includes a mode 401, a clamping member 403 configured for pressing the sapphire 50 and a pressing module 405 configured for pressing the ceramic powders 60. The pressing module 405 is a hydraulic module including a strut 4051 and an abutting portion 2053 which is connected to one end of the strut 4051. The mold 401 is made of graphite. There is a cavity 407 in the mold 401. The difference of the second embodiment and the first embodiment is the upper and lower surfaces of the sapphire 50 and the ceramic powder 60 is pressed to increase the bonding strength of the ceramic materials and the sapphire.

It is to be understood that, the side of the sapphire 50 which is used to combine with the ceramic materials may include V-shaped protrusions or concave, therefore, the bonding strength of the display window 10 and the supporting body 30 can be increased.

The panel 100 of this disclosure is made of sapphire integrated with ceramic powders by sintering, the bonding strength of the sapphire and ceramic materials is high. The sapphire has the advantages of high transparence, high hardness, and scratch resistance. At the same time, the ceramic materials has the advantages of high hardness, and low-cost. Therefore, the panel 100 of this disclosure has the advantages scratch resistance and low-cost.

It is believed that the present embodiments and their advantages will be understood from the foregoing description, and it will be apparent that various changes may be made thereto without departing from the spirit and scope of the embodiments or sacrificing all of its material advantages.

What is claimed is:

1. A panel manufacturing process, comprising:
    positioning a sapphire in a cavity of a mold in a sintering furnace and positioning ceramic powders around the sapphire, the sapphire being fixed on a central portion of the cavity, and the ceramic powders being filled around the sapphire in the cavity;
    sintering the sapphire and the ceramic powders to form a composite, pressing the sapphire to form a display window, and pressing the ceramic powders to form a supporting body;
    cutting the composite to form a panel comprising the display window and the supporting body; and
    surface treating the composite which has been cut;
    wherein the display window is surrounded by the support body, the supporting body defines a through hole, and the display window is received in the through hole and coupled to an inner wall of the through hole.

2. The panel manufacturing method of claim 1, wherein the ceramic powders are aluminum oxide powders, zirconia powders, silicon nitride powders, or steatite porcelain powders.

3. The panel manufacturing method of claim 1, the positioning step comprises placing the sapphire at the center of the ceramic powders.

4. The panel manufacturing method of claim 1, wherein the sintering step comprises heating the sintering furnace at a temperature rate at of 10 to 30° C./min to a range of 1400° C. to 1600° C., pressurizing a pressure of the furnace in a range of 10 to 40 Mpa, and maintaining a constant temperature and a constant pressure for 0.5 to 2 hours.

5. The panel manufacturing method of claim 1, the sintering step comprises pressing upper surfaces and lower surfaces of the sapphire and the ceramic powders.

6. A panel manufacturing process, comprising:
    positioning a sapphire in a cavity of a mold in a sintering furnace and positioning ceramic powders around the sapphire, the sapphire being fixed on a central portion of the cavity, and the ceramic powders being filled around the sapphire in the cavity;
    sintering the sapphire and the ceramic powders to form a composite, pressing the sapphire by a clamping member to form a display window, and pressing the ceramic powders by a pressing module to form a supporting body;
    cutting the composite to form a panel comprising the display window and the supporting body; and
    surface treating the composite which has been cut;
    wherein the display window is surrounded by the support body, the supporting body defines a through hole, and the display window is received in the through hole and coupled to an inner wall of the through hole.

7. The panel manufacturing method of claim 6, wherein the pressing module comprises a strut and an abutting portion connected to one end of the strut.

8. The panel manufacturing method of claim 6, wherein the ceramic powders are aluminum oxide powders, zirconia powders, silicon nitride powders, or steatite porcelain powders.

9. The panel manufacturing method of claim 6, the positioning step comprises placing the sapphire at the center of the ceramic powders.

10. The panel manufacturing method of claim 6, wherein the sintering step comprises heating the sintering furnace at a temperature rate at of 10 to 30° C./min to a range of 1400° C. to 1600° C., pressurizing a pressure of the furnace in a range of 10 to 40 Mpa, and maintaining a constant temperature and a constant pressure for 0.5 to 2 hours.

11. The panel manufacturing method of claim 6, the sintering step comprises pressing upper surfaces and lower surfaces of the sapphire and the ceramic powders.

* * * * *